(12) United States Patent
Kocin

(10) Patent No.: US 6,614,325 B1
(45) Date of Patent: Sep. 2, 2003

(54) RF/IF SIGNAL DISTRIBUTION NETWORK UTILIZING BROADSIDE COUPLED STRIPLINE

(75) Inventor: Michael J. Kocin, Poway, CA (US)

(73) Assignee: Northrop Grumman Corporation, Redondo Beach, CA (US)

( * ) Notice: Subject to any disclaimer, the term of this patent is extended or adjusted under 35 U.S.C. 154(b) by 0 days.

(21) Appl. No.: 09/653,500

(22) Filed: Aug. 31, 2000

(51) Int. Cl.[7] ................................................. H01P 5/18
(52) U.S. Cl. ........................ 333/12; 333/116; 333/128; 174/2.51
(58) Field of Search .......................... 333/12, 161, 128, 333/238, 116; 174/251, 261; 361/792, 800

(56) References Cited

U.S. PATENT DOCUMENTS

| | | | | |
|---|---|---|---|---|
| 4,647,878 A | * | 3/1987 | Landis et al. ................ | 333/116 |
| 4,658,334 A | * | 4/1987 | McSparran et al. ......... | 361/415 |
| 5,357,050 A | * | 10/1994 | Baran et al. ................. | 174/261 |
| 5,646,368 A | * | 7/1997 | Muyshondt et al. ........ | 174/261 |
| 5,764,489 A | * | 6/1998 | Leigh et al. ................. | 174/261 |
| 5,929,510 A | * | 7/1999 | Geller et al. ................ | 257/635 |
| 6,236,572 B1 | * | 5/2001 | Teshome et al. ............ | 174/261 |
| 6,239,387 B1 | * | 5/2001 | Wissell ........................ | 174/261 |
| 6,250,968 B1 | * | 6/2001 | Winings ...................... | 174/261 |
| 6,331,926 B1 | * | 12/2001 | Anthony ...................... | 361/56 |

FOREIGN PATENT DOCUMENTS

EP     0083476 A   *   7/1983  ................ 333/128

* cited by examiner

*Primary Examiner*—Justin P. Bettendorf
(74) *Attorney, Agent, or Firm*—Tarolli, Sundheim, Covell & Tummino L.L.P.

(57) ABSTRACT

A Printed Circuit Board (PCB) (30, 70, 102) and method of manufacturing same. The PCB (30, 70, 102) includes an embedded shielded conductor structure comprising a dielectric layer (42) disposed over a first conductor (40, 80, 84), and a second conductor (38, 78, 82) proximate and coupled to said first conductor (40, 80, 84) being disposed over said dielectric layer (42). The first (40, 80, 84) and second (38, 78, 82) conductors are juxtaposed to form a broadside coupled stripline. A first low noise ground layer (54, 94) is disposed under said first conductor (40, 80, 84), and a second low noise ground layer (52, 92) is disposed over said second conductor (38, 78, 82), these low noise ground layers typically being coupled to chassis ground. RF (32, 72) and digital (34, 74) portions of the PCB (30, 70, 102) are separated and isolated by a vertical ground shield (36, 76). The use of heavy, bulky RF connectors and cables may be eliminated or reduced.

35 Claims, 4 Drawing Sheets

RF/IF SIGNAL DISTRIBUTION NETWORK UTILIZING BROADSIDE COUPLED STRIPLINE

TECHNICAL FIELD OF THE INVENTION

The present invention is generally related to electronic circuitry, and more particularly to Printed Circuit Boards (PCBs).

BACKGROUND OF THE INVENTION

Electronic systems often comprise a motherboard coupled to one or more daughtercards, with the motherboard providing the electrical interconnections between the daughtercards. In aircraft communication systems, for example, the motherboard and daughtercards comprise PCBs which may be multi-layer circuit boards having interconnect layers separated by and sandwiched between insulating layers. Digital signals and some analog signals not particularly sensitive to electromagnetic interference (EMI) are typically transmitted throughout the communication system over etch lines on the interconnect layers. Radio Frequency (RF) and Intermediate Frequency (IF) signals (operating in the range of 20–45 MHz) are usually transmitted over shielded wires such as coax or twin-ax to electronic circuitry on the PCBs, for example. The shielded RF cables, wires and connectors tend to be large and quite heavy, which is particularly a problem in the space and aircraft communications industry.

What is needed in the art is a PCB capable of transmitting RF/IF signals via etch lines embedded within the PCB, rather than over shielded RF cables and connectors of the prior art that are heavy and consume board space.

SUMMARY OF THE INVENTION

The present invention achieves technical advantages as a PCB having imbedded conductors for transmitting highly sensitive RF, IF and analog signals. A broadside coupled stripline is located in an RF circuit portion of the PCB being RF isolated from digital circuit portions. The broadside coupled stripline comprises a first conductor separated from a second conductor by a dielectric layer. The first and second conductors may conduct a differential signal, or one of the conductors may conduct an RF signal while the other is grounded and serves as a shield. The RF/IF, analog and digital portions of the PCB are separated and isolated from one another by use of a continuous ground shield constructed with via holes/pads and traces that form a layer by layer wall around the RF/IF, and possibly analog circuit portions. The remainder of the PCB may be utilized for digital circuits and power distribution.

In one embodiment, disclosed is a PCB having an embedded shielded conductor structure. The shielded conductor structure includes a first conductor, a dielectric layer disposed over the first conductor, and a second conductor proximate and juxtaposed to the first conductor and disposed over the dielectric layer, so that the first and second conductors form a broadside coupled stripline.

Also disclosed is a PCB with an embedded shielded conductor structure where the shielded conductor structure includes a first low noise ground layer positioned horizontally and a first conductor disposed in, a first conductive layer over the first low noise ground layer. A dielectric layer is disposed over the first conductor, and a second conductor is disposed in a second conductive layer over the dielectric layer proximate the first conductor. A second low noise ground layer is disposed over the second conductor, and a ground structure extends vertically through the various layers proximate the first and second conductors. The first and second conductors form a broadside coupled stripline, while the low noise ground layers and vertical ground structure provide additional EMI shielding, the low noise ground layers preferably being coupled to chassis ground.

Further disclosed is a method of manufacturing a PCB having an embedded shielded conductor structure defined about RF circuitry adapted to route RF signals. The method includes the steps of disposing a first conductive layer over a first dielectric layer, etching the first conductive layer to form a first conductor, and disposing a second dielectric layer over the first conductor. A second conductive layer is disposed over the second dielectric layer, and the second conductive layer is etched to form a second conductor proximate and juxtaposed to the first conductor to form a broadside coupled stripline.

The present invention provides the ability to maintain signal integrity of the RF/IF signals in a PCB without the use of a shielded cable, and provides overall weight, volume and cost reduction for electronic systems through the elimination of RF switches, cables and connectors. Passive odd-mode broadside coupled stripline is used to replace RF cabling distribution due to its excellent noise immunity and satisfactory characteristic impedance tolerance. Sensitive RF/IF signals, analog signals, digital signals and power supply voltages may be routed in a single PCB or motherboard backplane through the highly integrated circuit technology disclosed herein. RF/IF, analog and digital conductive etch lines may be disposed in a coplanar fashion in a single manufacturing step onto each layer of a PCB. RF signal routing through a motherboard or backplane using a distribution point or passive divider allows a single receiver RF output to be distributed to multiple analog-to-digital (A/D) converter inputs, for example, without compromising signal integrity and without the use of an RF switch, splitter or other switching networks.

BRIEF DESCRIPTION OF THE DRAWINGS

In the drawings, which form an integral part of the specification and are to be read in conjunction therewith.

Like numerals and symbols are employed in different figures to designate similar components in various views unless otherwise indicated.

DETAILED DESCRIPTION OF PREFERRED EMBODIMENTS

Signals capable of being transmitted as airwaves through space are generally referred to as Radio Frequency (RF) signals. Intermediate Frequency (IF) signals, e.g. those between 20–45 MHz are sometimes mixed with analog signals to produce an RF signal. Because RF, IF and some analog signals are particularly sensitive to electromagnetic interference (EMI) in communication systems, these signal links are typically interconnected via shielded RF conductors such as coaxial cables and connectors, even if all circuit components are contained within a single PCB. The RF coaxial connectors may be mounted to a PCB, consuming board space and preventing the use of that board space for routing etch lines within the layers of the circuit card. Furthermore, in a communication system requiring more than one receiver and/or preprocessing circuit board, coaxial cables and additional RF switching systems may be required to route RF signals from a receiver Line Replaceable Module (LRM) to another LRM such as a Preprocessor LRM. The use of coaxial cabling is usually necessary to meet RF/IF signal performance requirements for parameters such as signal isolation, low loss and phase noise, for example.

Figure 1:
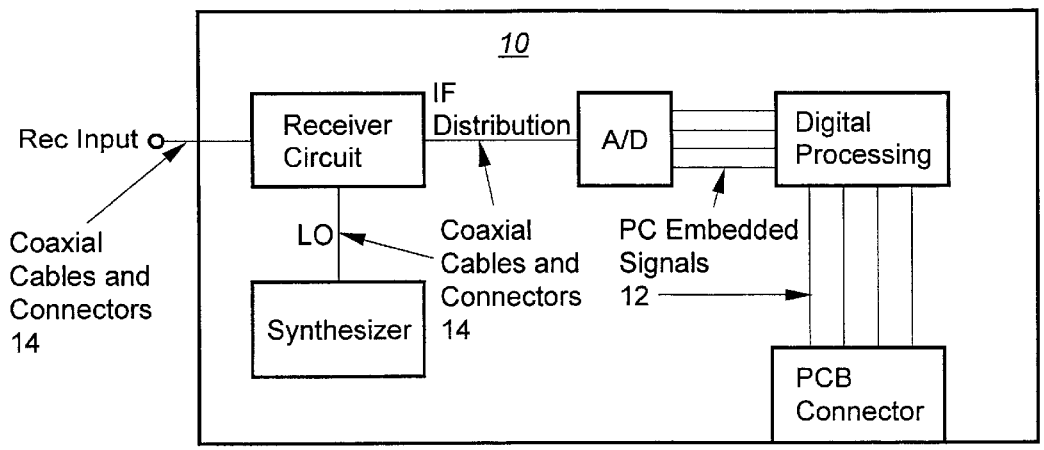
FIG. 1 is a block diagram of a prior art PCB having coaxial cables and connectors for transmitting RF/IF signals.
Figure 2:
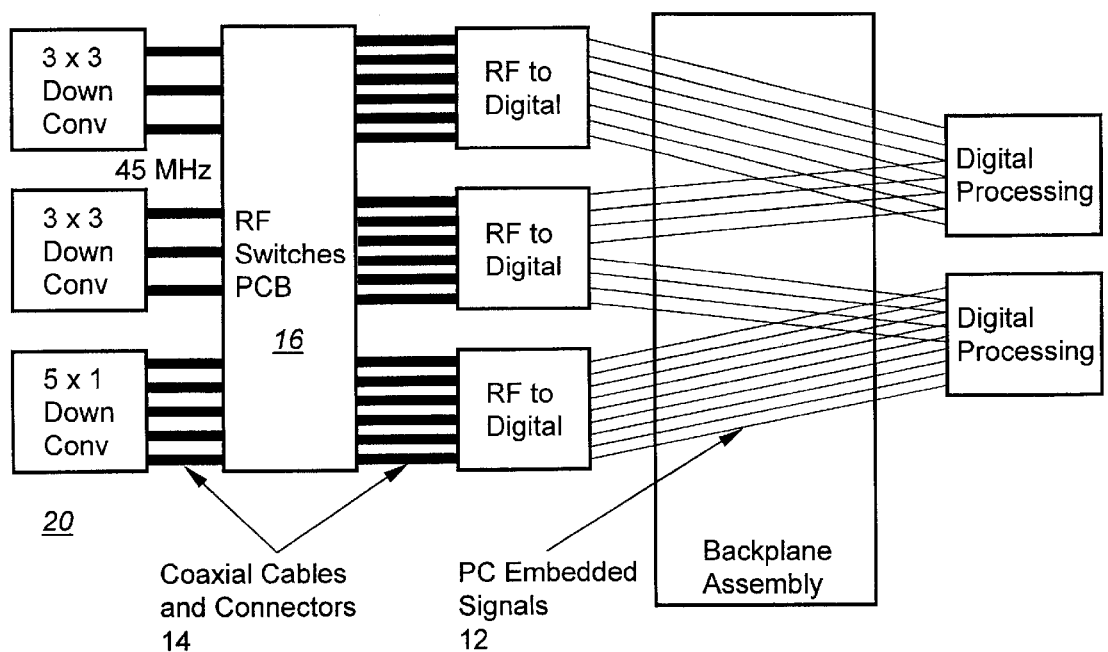
FIG. 2 is a block diagram of a prior art system with a digital backplane having multiple receivers and converters, requiring coaxial cables and connectors for RF/IF signal transmission.

FIG. 1 illustrates a prior art PCB design 10 requiring coaxial cables and connectors 14 to link portions of the receiver circuit having RF, IF and/or analog signals and a digital section of the PCB 10. An alternative prior art approach is an electronic system shown generally at 20 in the block diagram of FIG. 2. The electronic system 20 is typically contained within a single enclosure, for example, in a chassis. A plurality of coaxial cables and connectors 14 are required inside the enclosure to couple the downconverter (Down Conv) PCBs, which couple RF signals from RF receiver, to the RF switch PCB 16. The RF switch PCB 16 is also coupled to the RF to Digital PCBs with coaxial cables and connectors 14. The use of the coaxial cables and connectors 14 severely limits the available volume within the enclosure or chassis for the remaining interconnection cabling. RF or coaxial connectors are required on the downconverter and RF to Digital PCBs, impacting the space available for digital input/output connectors and the outline and mounting footprint of the PCBs. Furthermore, it is desirable to eliminate the RP Switch PCB 16 to reduce weight and volume within the electronic system 20.

What is needed in the art is a PCB design capable of transmitting and shielding RF/IF signals without the use of coaxial cable and connectors. One prior art attempt to transmit and shield RF signals within a PCB involved routing two etch lines or conductors side-by-side within a single conductive layer in a coplanar fashion, known as edge-coupled striplines. This conventional approach utilized only the trace height (0.0007–0014 in.) for physical coupling of differential lines. The shielding effect was limited to the height of the conductor or circuit line, resulting in very small and ineffective electrical wave properties.

The present invention achieves technical advantages and solves the problems of the prior art by routing two conductors proximate and juxtaposed to one another, yet spaced apart by a uniform thickness dielectric PCB layer within a shielded assembly. The two conductors are preferably coupled the full width of the conductors or circuit lines to maximize the shielding effect. The two proximate conductors having a width and spaced apart by a dielectric layer referred to hereafter as a passive odd-mode broadside coupled stripline. The term "odd-mode" is defined herein as used for differential signals, i.e., +30 on one line –30 on second line with signals running in opposite directions. Conceptually, the present invention performs similarly to a twin-ax cable, which has two wires running within a shielded cable. The two conductors are adapted to be used to conduct differential signals, e.g. analog and digital positive and negative signals, within the PCB. Alternatively, one of the two conductors may be grounded and used as an additional shielding component to provide additional isolation for high frequency RF.

Figure 3:
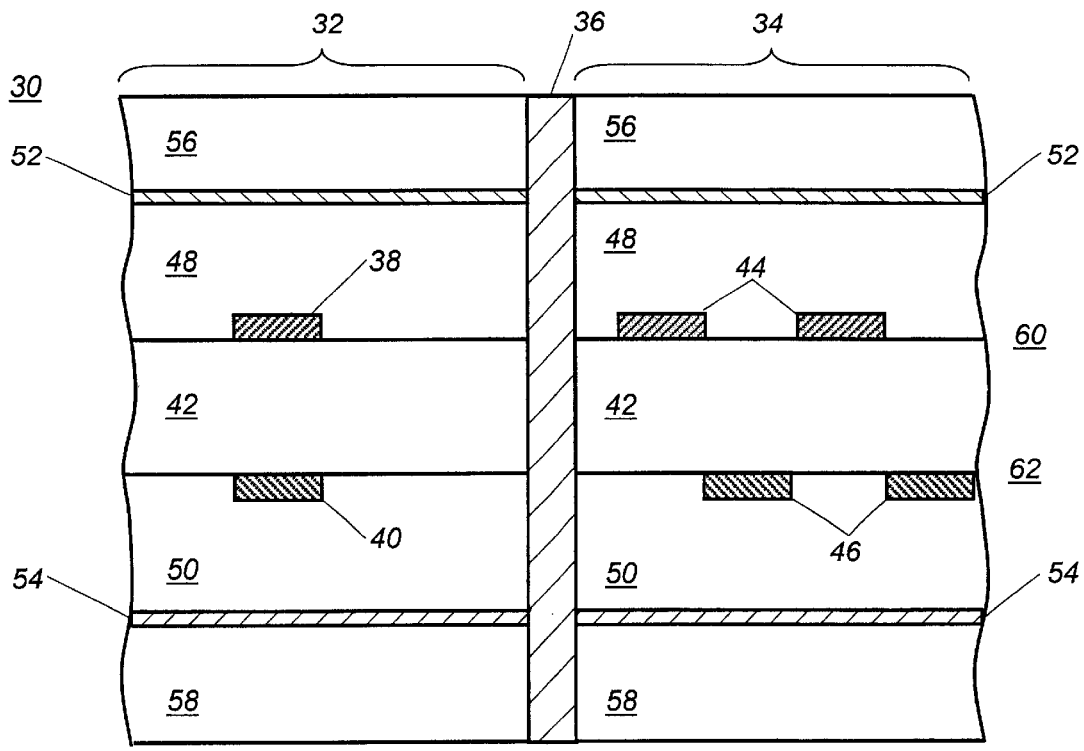
FIG. 3 illustrates a cross-sectional view of a PCB of the present invention having a digital portion and an RF portion with a broadside coupled stripline.

The present invention is shown generally as a PCB at 30 in the block diagram of FIG. 3. The PCB 30 comprises an RF circuit portion 32 and a digital circuit portion 34 separated by a continuous vertical ground structure 36. A first conductor 38 formed in an interconnect layer 60 is separated from a second conductor 40 formed in an interconnect layer 62 by a uniform thickness dielectric layer 42 which may be a 0.005 inch thick core layer, for example. The first and second conductors 38 and 40, respectively, are preferably coupled substantially along their entire widths as shown, with the opposing surfaces being juxtaposed, and effectively form a broadside coupled stripline.

Two additional shielding structures in the PCB 30 include two low noise or quiet continuous RF ground layers 52 and 54 disposed horizontally proximate and about the first and second conductors 38 and 40, each being electrically coupled to vertical ground structure 36. Quiet RF ground layer 52 is disposed above the first conductor 38 separated therefrom by a uniform thickness dielectric layer 48 which may comprise, for example, a 0.008 inch prepreg layer. Similarly, quiet RF ground layer 54 is disposed below the second conductor 40 separated therefrom by a uniform thickness dielectric layer 50 which may comprise, for example, a 0.008 inch prepreg layer. The quiet RF ground layers 52 and 54 are used as RF reference levels and are preferably coupled to the chassis ground (not shown). To avoid mixing the digital signals and RF signals and create additional noise, the quiet RF ground layers 52 and 54 are preferably not coupled to the power supply line returns or any other power paths of the PCB 30 or overall system. This low noise ground (LNG) approach maximizes the noise tolerance of the RF, IF or analog signals routed on conductors 38 and 40. The quiet RF ground layers 52 and 54 are coupled to and adjacent dielectric layers 56 and 58, respectively, which may serve as the exterior layer of the PCB 30.

Multi-layer PCBs typically range in the number of layers depending on the circuitry and system requirements, for example, from 2–14 layers for a daughtercard and 28 layers or more for a motherboard backplane. The PCB 30 shown in FIG. 3 is exemplary to show the present invention and may include other layers, not shown. Digital portion 34 of the PCB 30 may comprise single ended bus odd channels 44 formed in interconnect layer 60 alternated with signal ended bus even channels 46 formed in interconnect layer 62, as shown. Advantageously, the digital channels 44 may be etched in the same manufacturing step as the RF conductors 38 within interconnect layer 60. Likewise, digital channels 46 may be etched in the same manufacturing step as the RF conductors 40 within interconnect layer 62. Thus, the present invention eliminates or reduces the use of coaxial connectors and cables without adding any additional manufacturing steps.

Figure 4:
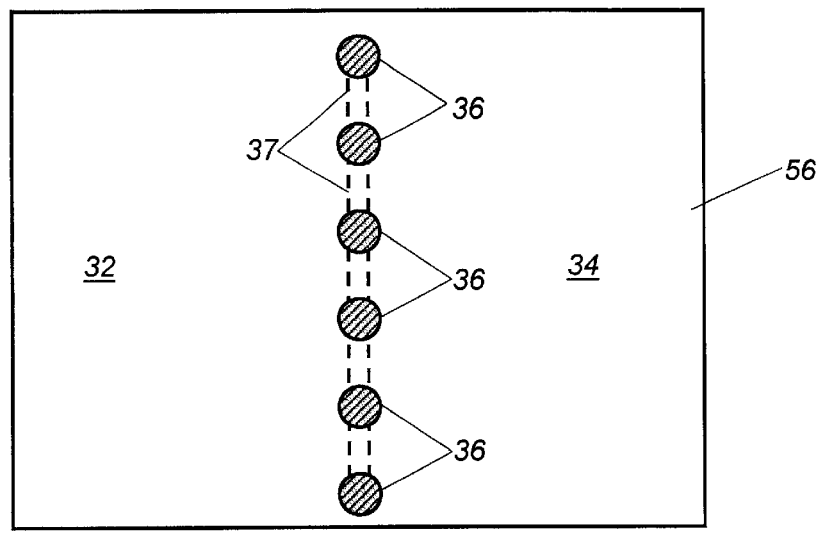
FIG. 4 is a top view of the PCB of FIG. 3, showing a picket fence ground arrangement for coplanar isolation between the digital portion and RF portions.

The vertical ground structure 36 preferably comprises a picket fence ground that may include a series of plated-through holes extending the entire vertical length of the board. Preferably, no electronic components are inserted into the holes of the vertical ground structure 36 to improve isolation and avoid leaking digital data or noise into the RF portion 32 of the PCB 30. FIG. 4 shows a top view of the PCB 30 of FIG. 3, demonstrating a possible pattern for the vertical ground structure 36 of the present invention separating and isolating the RF 32 and digital 34 circuit portions. The picket fence ground 36 may comprise, for example, 30 mil via holes surrounded by a 5 mil pad for a total 40 mil structure, spaced apart by 75–100 mil centers, for example. The vertical ground structure 36 is effectively stitched across the PCB 30 spaced apart by a predetermined distance. The spacing of the plated through holes is dependent on the amount of isolation needed, and these dimensions may be varied to meet design parameters of specific circuits and systems. The higher the frequency of the RF/IF/analog signals in the RF portion 32, the more critical the isolation from the digital portion 34 of the PCB 30. Preferably, the holes and plating are consistent with the size requirements for other plated-through holes in the board 30 so that no additional manufacturing steps are required. The isolation provided by the picket fence ground 36 may be further improved by routing connective etch lines 37 between the plated-through holes in one or more interconnect layers 60 and 62 of the PCB 30 (see FIG. 4). The picket fence ground 36 constructed with via holes/pads and traces 37 form a layer-by-layer wall around the RF portion 32 of the PCB 30, and possibly around the analog circuits (not shown). The remainder of the PCB 30 may then be utilized for digital circuits and power distribution.

One of the two conductors 38, 40 may be used as an additional shielding component to provide additional isolation for high frequency RF signals routed on the other conductor. Grounding one of the conductors results in a high amount of isolation, because the coupling coefficients of the juxtaposed conductors are very high from positioning the conductor pairs 38 and 40 so that they are coupled on either side of core layer 42. The grounded conductor 38 or 40 acts as a high frequency barrier to EMI noise within the system.

Positioning of the two conductor lines 38 and 40 in a broadside-coupled stripline approach, separated by the thin circuit board core 42 and surrounded by quiet RF ground planes 52 and 54 emulates an 8-dB coupler, which is very tightly coupled. Substantially the entire line width of the conductors 38 and 40 (0.006–.008 inch, for example) is preferably coupled together to increase the coupling coefficients in the broadside coupled approach of the present invention. An 8-db coupler is achievable for both a differential signal and an RF line to ground signal.

Figure 5:
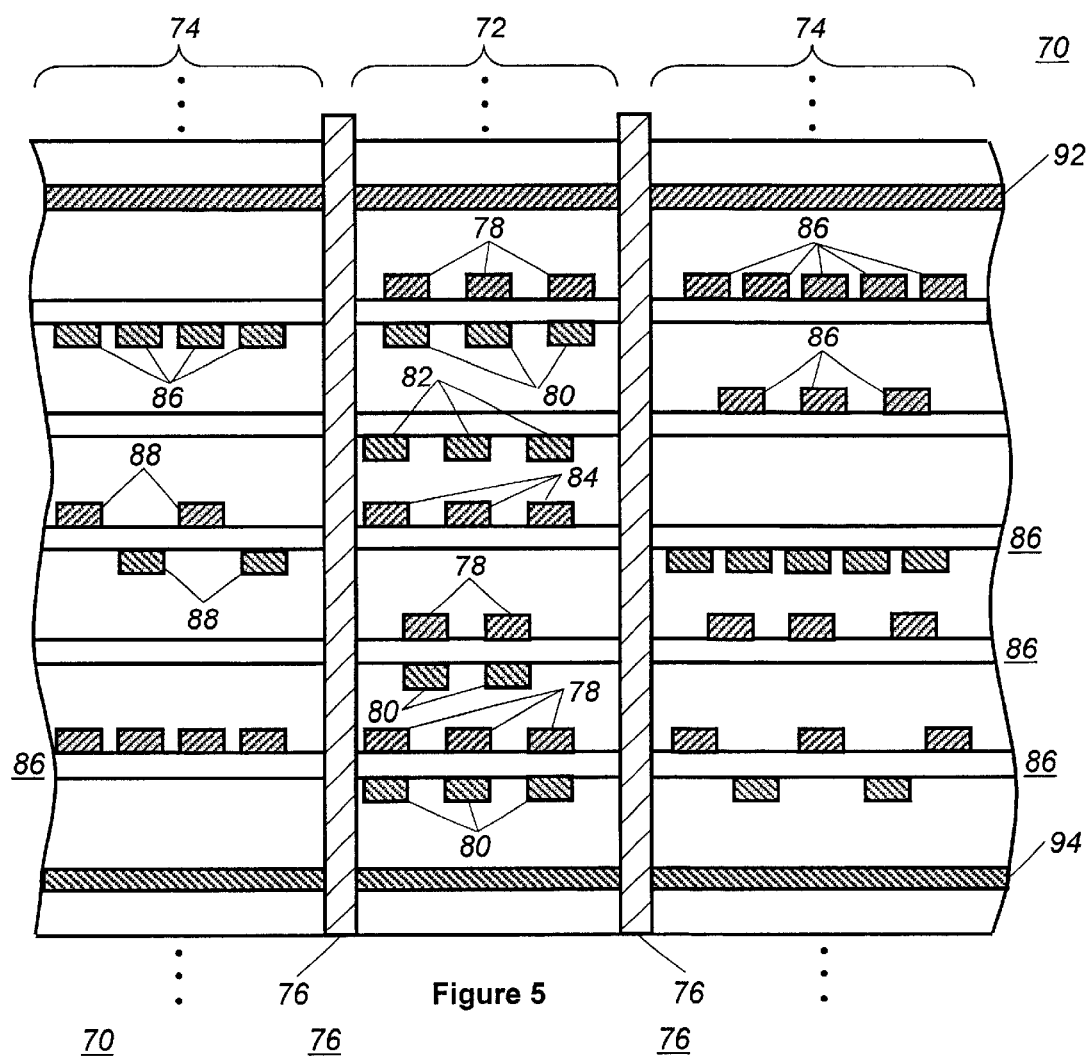
FIG. 5 is a cross-sectional view of a motherboard of the present invention having an RF portion with a broadside coupled stripline adjacent a digital portion.

FIG. 5 shows generally at 70 an alternate embodiment of the present invention with an RF circuit portion 72 surrounded by digital circuit portions 74. Continuous vertical ground structures 76 separate the RF portion 72 and digital portions 74. The RF portion 72 is a vertical coplanar "keep out zone" that is shielded from other digital 74 and analog (not shown) portions of the PCB by the broadside coupled stripline structure (conductor pairs 78 and 80, 82 and 84), vertical ground structure 76 and quiet RF ground layers 92 and 94.

FIG. 5 illustrates that the various interconnect layers may be reused for more than one PCB technology. In RF portion 72, conductors 78 and 80 are coupled in pairs and comprise a 100 ohm differential broadside-coupled stripline. Conductors 78 and 80 are adapted to transmit 100 ohm differential analog signals, or single-ended RF signals, for example. Likewise, conductors 82 and 84 are juxtaposed and coupled in pairs and may comprise a 100 ohm differential broadside-coupled stripline. Conductors in the digital portion 74 are preferably formed in the same manufacturing step as the conductors in the RF portion 72. Conductors 86 in digital portion 74 may comprise 50 ohm single-ended stripline, and conductors 88 may comprise 50 ohm single-ended offset stripline, for example. Additionally, dielectric, voltage supply and return layers may be interspersed with the various interconnect layers shown.

Although RF portions 32 and 72 are referred to herein as RF portions for convenience, it is intended that RF portions 32 and 72 may comprise RF, IF and analog signals, either separately or in combination. These types of electronic signals are exemplary of signals sensitive to noise and EMI, and would therefore benefit from the broadside coupled stripline approach with electrical isolation from digital circuit portions 34, 74 in accordance with the present invention.

The present invention allows the incorporation of highly sensitive RF signals, analog signals, digital signals and power supply voltages into a single PCB. 30, 70 structure. Application of offset parallel-coupled single ended stripline traces allows the PCB 30, 70 area not utilized for RF/IF signals to be fully utilized by allowing digital signals to coexist on the same layers of the circuit card. This approach is quite different from present technology in that it does not require a reference-trace-reference to implement single ended traces. Instead, single-ended stripline is achieved by implementing the reference-trace-trace-reference (Offset dual Stripline) as illustrated in FIG. 3 and further detailed in FIG. 5. The present invention implements odd-mode differential broadside coupled stripline traces in the RF portion 72 for differential analog, even mode for single ended RF and offset parallel-coupled single ended stripline traces in the digital portion 74 in co-planarity, reducing the need for an increase in board layer count. A differential impedance of 100 Ohms for broadside-coupled stripline traces and 50-Ohm single-ended stripline traces may be satisfied on the same interconnect layer.

Because the industry standard at the present time only permits a single line width and thickness to be etched on each circuit layer, a problem of differing coplanar trace characteristic impedance with the implementation of broadside coupled and offset parallel-coupled stripline structures exists. However, this problem is overcome with the present invention through compromising the PCB 70 architecture, balancing signal line width, thickness and spacing from ground—all adjusted to optimize both RF and digital performance.

Figure 6:
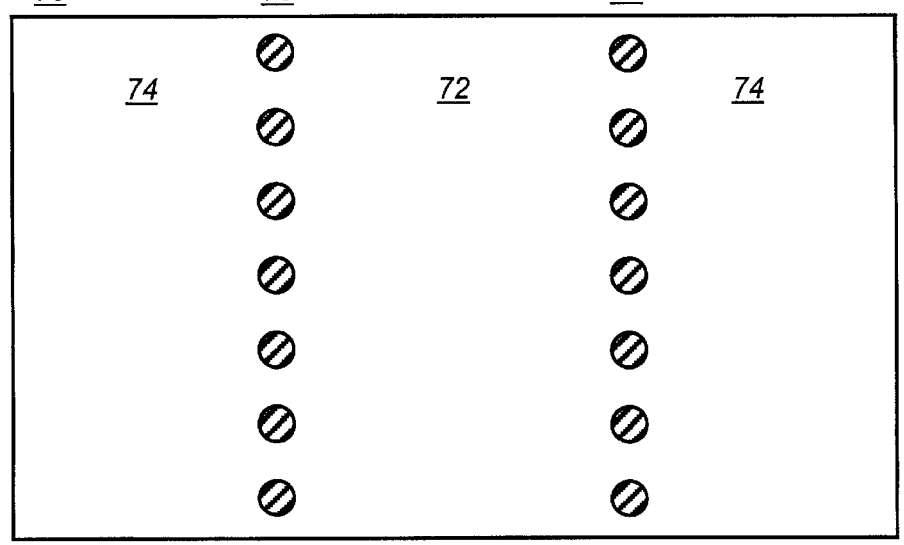
FIGS. 6 and 7 illustrate top views for the motherboards adapted for use with the PCB shown in FIG. 5.
Figure 7:
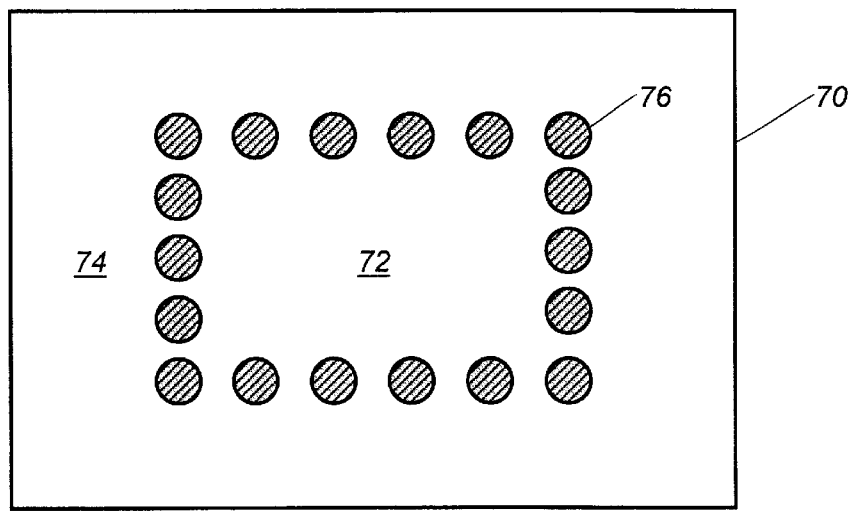

FIGS. 6 and 7 illustrate possible configurations for the RF portion 72 and digital portions 74 of the PCB 70. The RF portion 72 may comprise an inner third section of the PCB 70 separated from the digital portions 74 comprising the remaining two-thirds of the board by the vertical ground structure 76, as shown in FIG. 6. Alternatively, the RF portion 72 may comprise an interior rectangular section of the PCB 70 separated from the digital portions 74 comprising the perimeter of the board by the vertical ground structure 76, as shown in FIG. 7. Other configurations and shapes may be utilized, and are contemplated in accordance with the present invention.

Figure 8:
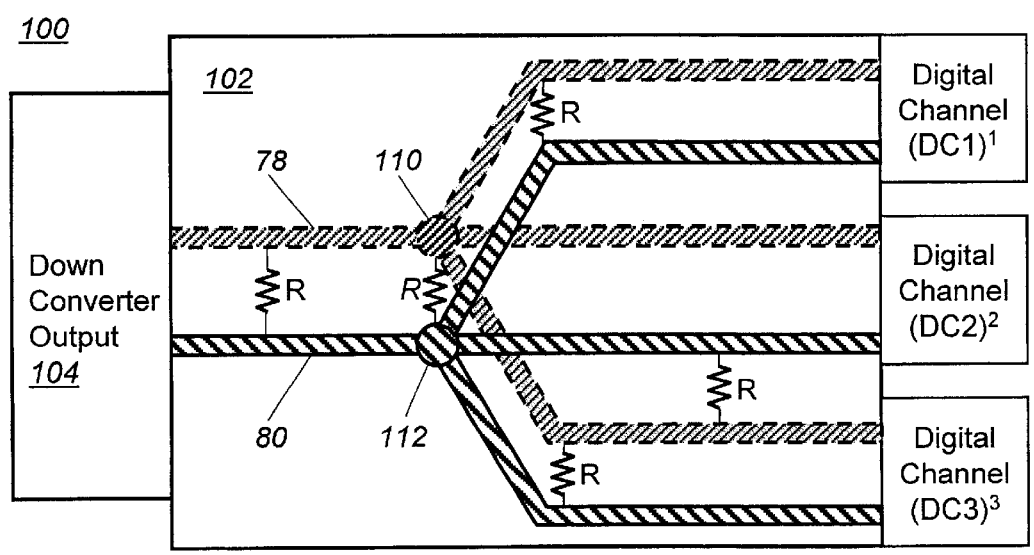
FIG. 8 shows a perspective view of an embodiment of the present invention having a backplane with a passive distribution point through the multi-layered structure of an odd-mode broadside-coupled stripline circuit.

Many analog and RF signals in prior art communications systems require an RF switch 16 or splitter to distribute the RF signal to multiple digital inputs (FIG. 2), e.g. A/D converters. With the present invention, passive distribution of RF/IF signals through the use of impedance matched integrated printed circuit dividers allows single RF output signals to be distributed to multiple A/D devices within the PCB, eliminating the need for RF switching. FIG. 8 illustrates a schematic representation of how the broadside coupled stripline of the present invention may used to eliminate the need for RF switches 16 in the communications system. FIG. 8 contains a high level illustration explaining the distribution network design of the present invention. The pair of conductors 78 and 80 comprises a broadside coupled stripline as previously described, with conductors 106 and 108 fanned out at passive distribution points 110 and 112, respectively. An RF signal from the downconverter output 104, representative of the output from an RF receiver, is split by the distribution points 110 and 112, and distributed to Digital Channels 1, 2 and 3 which may be the input to an A/D converter, for example. The resistors R represent an embedded impedance within the circuit board 102 having capacitive, inductive and resistive physical characteristics inherent of the PCB 102, along with the signal routing effects. Thus, the use of additional surface devices is eliminated by using the characteristics of the PCB 102 to distribute RF signals.

Distribution points 110 and 112 preferably comprise a via pad and hole utilized within the PCB 102 as a signal divider, feeding three or more A/D converter inputs DC1, DC2, and DC3 on an RF to Digital Converter, for example. The output impedance of the downconverter may be set at 100 Ohms differential within the PCB 102, and the via pad impedance may be set at a level allowing the signal to be distributed to several A/D converter inputs DC1, DC2, and DC3, with each leg having an approximate impedance of 100 Ohms. The resulting signal at DC1, DC2, and DC3 is approximately the same magnitude, although there may be insignificant line loss. Signal integrity as the single output of the downconverter is measured at the motherboard interface. The via pad acts as a quasi divider (distribution point 110, 112) and eliminates the need for an RF switch to direct the RF signal to each A/D converter input (at DC1, DC2, and DC3). The length of the legs of the signal distribution after (to the right of) the distribution points 110, 112 must be kept to a minimum to ensure signal integrity. Additionally, since the signal integrity is critical for the overall system performance, the divider legs are preferably phase-matched by keeping parallel line lengths matched with very small differentials. Note that impedance levels are preferably established utilizing signal to RF ground.

The RF/IF signal distribution network 30, 70 and 100 utilizing broadside coupled stripline disclosed herein provides several advantages. The present invention maintains signal integrity of RF/IF signals without the use of a shielded cable, and provides overall weight, volume and cost reduction for communications electronic systems through the elimination of RF switches, cables and connectors.. Passive odd-mode broadside coupled stripline is used to replace RF cabling distribution due to its excellent noise immunity and satisfactory characteristic impedance tolerance. Sensitive RF/IF signals, analog signals, digital signals and power supply voltages may be contained in a single PCB or motherboard backplane. RF/IF, analog and digital conductive etch lines may be disposed in a coplanar fashion in a single manufacturing step onto each layer of a PCB. RF signal routing through a motherboard or backplane using a distribution point or passive divider allows a single receiver output 104 to be distributed to multiple A/D converter inputs DC1, DC2, DC3 without compromising signal integrity, and without the use of an RF switch, splitter or other switching networks.

Though the invention has been described with respect to specific preferred embodiments, many variations and modifications will become apparent to those skilled in the art upon reading the present application. For example, the present invention is beneficial to any PCB application having RF, IF and/or analog signals, and applies to both stand-alone printed circuit applications and large, complex backplane interconnection schemes. The invention is shown herein in use with PCBs having both RF/IF/analog and digital board portions; however, a PCB having only RF portions, only IF portions or only analog portions would benefit from the present invention by eliminating the need for heavy shielded cables and connectors. Also, a digital differential signal would benefit from the broadside coupled stripline embedded within a PCB described herein. A PCB 30 or 70 may comprise more than one RF portion 32, 72 and digital portion 34, 74, and the RF portions 32, 72 may be positioned on an edge, center or any position on a board, for example. It is therefore the intention that the appended claims be interpreted as broadly as possible in view of the prior art to include all such variations and modifications.

What is claimed is:

1. A printed circuit board (PCB), comprising;
   a first conductor that has a surface;
   a second conductor that has a surface; and
   a dielectric layer that extends from the surface of the first conductor to the surface of the second conductor to space apart the first conductor and the second conductor to form a broadside coupled stripline adapted to conduct an RF signal wherein said first and second conductors comprise a passive distribution point having an established impedance, the passive distribution point formed from a via, and a plurality of divider legs fanned out at the passive distribution point, the plurality of divider legs being phase-matched to facilitate signal integrity, such that the RF signal is split into a plurality of RF signals having approximately the same magnitude as the RF signal along the plurality of divider legs.

2. The PCB of claim 1 wherein said first and second conductors have a width, said first conductor surface and said second conductor surface being opposed, wherein said opposing surfaces of first and second conductors are juxtaposed and coupled substantially along their entire said widths.

3. The PCB of claim 1 further comprising a shielded structure comprising,
   a first low noise ground layer disposed horizontally proximate and about said first conductor; and
   a second low noise ground layer disposed horizontally proximate and about said second conductor.

4. The PCB of claim 3 wherein said PCB is coupleable to a chassis of an electronic system, wherein said first and second low noise ground layers are coupleable to said chassis.

5. The PCB of claim 4 wherein said first conductor is disposed in a first layer, said second conductor is disposed in a second layer, said first layer, said dielectric layer and said second layer each being generally positioned in a horizontal direction, said shielded conductor structure further comprising:
   a ground structure extending vertically through said first, dielectric, and second layers proximate said first and second conductors.

6. The PCB of claim 5 wherein said vertical ground structure comprises a picket fence ground.

7. The PCB of claim 6 wherein said picket fence ground comprises a plurality of plated-through holes coupled together by etch lines in at least said first layer.

8. The PCB of claim 5 wherein said PCB comprises an RF portion and a first digital portion, said RF portion comprising said first and second conductors, said first digital portion comprising at least a third conductor disposed within said first layer.

9. The PCB of claim 8 wherein said vertical ground structure is disposed between said RF portion and said first digital portion.

10. The PCB of claim 9 wherein said PCB further comprises a second digital portion, wherein said vertical ground structure is disposed between said RF portion and said first and second digital portions.

11. The PCB of claim 1 wherein the plurality of divider legs is phase matched by keeping parallel line lengths matched.

12. The PCB of claim 1 wherein first conductor is adapted to conduct an RF/IF signal and said second conductor is grounded and adapted to shield said first conductor from electromagnetic interference (EMI).

13. The PCB of claim 12 wherein said second conductor is coupled to a chassis ground reference.

14. The PCB of claim 1 wherein said first and second conductors are adapted to conduct a differential analog signal.

15. A printed circuit board (PCB) comprising:
a first low noise ground layer positioned horizontally;
a first conductor disposed in a first layer over said first low noise ground layer;
a dielectric layer disposed over said first conductor;
a second conductor proximate said first conductor and disposed in a second layer over said dielectric layer, the dielectric layer extends from a surface of the first conductor to a surface of the second conductor to space apart the first conductor and the second conductor to form a broadside coupled stripline;
a second low noise ground layer disposed over said second conductor; and
a ground structure extending vertically through said first low noise ground, first, dielectric, second, and second low noise ground layers proximate said first and second conductors, wherein said PCB comprises an RF portion and a digital portion, said RF portion comprising said first and second conductors, said digital portion comprising at least a third conductor disposed within said first layer, and wherein said vertical ground structure is disposed between said RF portion and said digital portion.

16. The PCB of claim 15 wherein said first and second conductors have a width, said first conductor surface and said second conductor surface being opposed, wherein said opposing surfaces of first and second conductors are juxtaposed and coupled substantially along their entire said widths.

17. The PCB of claim 15 wherein said vertical ground structure comprises a picket fence ground including a plurality of plated-through holes coupled together by etch lines in at least said first layer, wherein said PCB is coupleable to a chassis of an electronic system, wherein said first and second low noise ground layers are coupleable to said chassis.

18. The PCB of claim 15 the dielectric layer extends through both the RF portion and the digital portion such that the RF and digital portions share a common dielectric free of any conductor.

19. The PCB of claim 15 wherein the digital portion comprises one of a single ended bus odd channel and a single ended bus even channel formed in the first layer and one of a single ended bus odd channel and a single ended bus even channel formed in the second layer.

20. A method of manufacturing a printed circuit board (PCB) adapted to route RF signals, said method comprising the steps of:
providing a first dielectric layer;
disposing a first conductive layer over said first dielectric layer;
etching said first conductive layer to form a first RF conductor and a first digital conductor;
disposing a second dielectric layer over said first RF conductor and said first digital conductor;
disposing a second conductive layer over said second dielectric layer;
etching said second conductive layer to form a second RF conductor proximate and coupled to said first RF conductor, the second dielectric layer extends from a surface of the first RF conductor to a surface of the second RF conductor to space apart the first RF conductor and the second RF conductor to form a broadside coupled stripline adapted to conduct an RF signal; and
forming a ground structure extending vertically through said layers to separate the PCB into a RF portion and a digital portion, the first and second RF conductors being disposed in the RF portion and the first digital conductor being disposed in the digital portion, the ground structure mitigating the leaking of digital noise from the digital portion into the RF portion.

21. The method of claim 20 wherein said first and second RF conductors have a width, said first RF conductor surface being opposed to said second RF conductor surface, wherein said step of etching said second conductive layer comprises forming the second RF conductor to have the same width as and juxtaposed to said first RF conductor surface along substantially their entire length.

22. The method of claim 20, further comprising the step of disposing a first low noise ground layer over said first dielectric layer, after the step of providing a first dielectric layer, and further comprising the step of disposing a second low noise ground layer over said second RF conductor, after said etching said second conductive layer step.

23. The method of claim 20 further comprising forming a via to function as passive distribution point with an established impedance, and forming a plurality of fanned out divider legs of the first and second RF conductors to facilitate RF switching.

24. The method claim 20 further comprising forming a second digital conductor in said second conductive layer, the first digital conductor and said second digital conductor being configured as one of a single ended bus odd channel and a single ended bus even channel.

25. The method of claim 24 wherein said step of forming a vertical ground structure comprises forming a picket fence ground including a plurality of plated-through holes, wherein the step of etching said first conductive layer comprises forming etch lines between said plated-through holes of said picket fence ground.

26. A printed circuit board (PCB) having a RF portion and a digital portion, the PCB comprising:
a first layer having a first conductor that has a surface, a width and a length;
a second layer having a second conductor that has a surface, a width and a length;
a dielectric layer disposed between the first layer and the second layer that extends from the surface of the first conductor to the surface of the second conductor along the width and length of the first conductor and the second conductor to space apart the first conductor and the second conductor, the first conductor and the second conductor juxtaposed to one another along the surfaces of the first and second conductors substantially along their respective lengths, the first conductor and the second conductor form a broadside coupled stripline adapted to conduct radio frequency (RF) signals;

a first via coupled to the first conductor, the first conductor being fanned out at the via to form a plurality of divider legs provided to a plurality of respective digital channels, the divider legs being phase-matched to facilitate signal integrity;

a second via coupled to the second conductor, the second conductor being fanned out at the via to form a plurality of divider legs provided to the plurality of respective digital channels, the divider legs being phase-matched to facilitate signal integrity wherein the first conductor and second conductor are formed of a passive odd-mode broadside coupled stripline, such that the second conductor is coupled to RF ground wherein the first conductor, the second conductor and the via are disposed in the RF section;

at least one additional electrical conductor to carry digital signals in at least one of the first layer and the second layer in the digital portion of the PCB; and a shielded assembly that separates the RF portion from the digital portion and isolates the first conductor and the second conductor from interference from digital noise from the digital portion.

27. The PCB of claim 26, the dielectric layer having a uniform thickness.

28. The PCB of claim 27, the dielectric layer having a thickness of about 0.005 inches.

29. The PCB of claim 26, the second conductor being grounded to provide additional isolation from interference.

30. The PCB of claim 26, the shielded assembly comprising a first ground layer spaced apart from the first conductor by a second dielectric layer, a second ground layer spaced apart from the second conductor by a third dielectric layer, the first and second ground layers being coupled to a ground structure substantially perpendicular the first and second continuous ground layers, the ground structure isolates the radio frequency signals from other electrical signals on the PCB.

31. The PCB of claim 30, the second and third dielectric layers being prepeg layers.

32. The PCB of claim 31, the prepeg layers each having a thickness of about 0.008 inches.

33. The PCB of claim 30, the ground structure comprising a plurality of plated-through holes coupled to by traces in at least one interconnect layer to form a layer-by-layer wall.

34. The PCB of claim 26, wherein the shielded ground structure is coupled to a ground other than a power ground and the RF ground.

35. The PCB of claim 26, the first and second conductors each having widths of about 0.006 to about 0.008 inches.

* * * * *